United States Patent [19]

Aihara et al.

[11] 4,163,951
[45] Aug. 7, 1979

[54] FREQUENCY DISCRIMINATOR PRODUCING AT LEAST ONE OF TWO PULSE SEQUENCES REPRESENTING IN AVERAGE THE RESULT OF FREQUENCY DISCRIMINATION

[75] Inventors: Shigenobu Aihara; Isao Haga; Motoo Mizumura, all of Tokyo, Japan

[73] Assignee: Nippon Electric Co., Ltd., Tokyo, Japan

[21] Appl. No.: 886,699

[22] Filed: Mar. 15, 1978

[30] Foreign Application Priority Data

Mar. 15, 1977 [JP] Japan .................................. 52-27571

[51] Int. Cl.$^2$ .......................... H03B 3/04; H03K 5/20
[52] U.S. Cl. .................................... 331/1 A; 307/232;
307/233 R; 328/134; 328/155; 331/17; 331/27
[58] Field of Search ....................... 331/17, 18, 25, 27,
331/1 A; 307/233 R, 232; 328/133, 134, 155;
329/50, 122, 124; 332/19; 325/419, 421, 423

[56] References Cited

U.S. PATENT DOCUMENTS

| | | | |
|---|---|---|---|
| 3,514,719 | 5/1970 | Rhodes | 329/50 X |
| 3,610,954 | 10/1971 | Treadway | 328/133 X |
| 3,748,589 | 7/1973 | Miller | 331/17 X |

*Primary Examiner*—Siegfried H. Grimm
*Assistant Examiner*—Edward P. Westin
*Attorney, Agent, or Firm*—Sughrue, Rothwell, Mion, Zinn and Macpeak

[57] ABSTRACT

In a frequency discriminator for a first and a second input signal of a first and a second frequency, a phase detector produces first and second rectangular pulse sequences. When the first input signal leads the second by 0° through 180°, the first pulse sequence takes a predetermined peak value with an instantaneous frequency corresponding to the phase difference while the second one continuously has the peak value. When the first input signal lags behind the second by 0° through 180°, the second pulse sequence takes the peak value with the instantaneous frequency while the first one continuously has the peak value. A low-pass filter rejects components of the first pulse sequence which are higher than the first and second frequencies. A high-pass filter has a prescribed cutoff frequency for rejecting lower-frequency components of the low-pass output to produce an output pulse sequence representing in average the difference between the first and second frequencies when the first frequency is higher than the second. Alternatively or additionally, a similar set of a low-pass and a high-pass filter produces a like output pulse sequence when the first frequency is lower than the second. At least one of the output pulse sequences is used as a discriminator output signal either per se or after conversion to a substantially d.c. signal. The frequency discrimination characteristics depend on the prescribed cutoff frequency. In an automatic frequency control (AFC) loop, both d.c. signals may be supplied to a voltage controlled oscillator through a differential circuit.

6 Claims, 4 Drawing Figures

FREQUENCY DISCRIMINATOR PRODUCING AT LEAST ONE OF TWO PULSE SEQUENCES REPRESENTING IN AVERAGE THE RESULT OF FREQUENCY DISCRIMINATION

BACKGROUND OF THE INVENTION

This invention relates to a frequency discriminator, which may be used either in a frequency modulator or a frequency demodulator.

In general, a frequency modulator comprises an oscillator for generating a carrier signal that is subjected to frequency modulation. Although the carrier signal should have a predetermined carrier frequency, it is difficult with a usual oscillator to achieve a sufficient frequency stability. A controllable oscillator is, therefore, used in an automatic frequency control loop together with a frequency discriminator operable in a certain frequency range to provide an automatically stabilized carrier frequency. In a simple model, the frequency stabilization is carried out by setting the zero or reference frequency of the frequency discriminator at the nominal frequency of the controllable oscillator. Those circuit constants of the frequency discriminator which determine the center frequency of the operable frequency range thereof are, however, subject to variation that results from long-term changes and, above all, changes in the ambient temperature. Due to the temperature dependency of the circuit constants, the highest possible frequency stability of the carrier frequency is about 20 PPM/°C. In an improved model, the controllable oscillator output signal is once mixed with a standard output signal of a crystal oscillator into a frequency-converted signal of a lower frequency so as to enable the frequency discriminator to operate in a lower frequency range. This reduces the temperature dependency of the frequency discriminator center frequency to provide as high a frequency stability as 0.5 PPM/°C. In another improved model, use is made of a crystal oscillator for generating a standard signal and a pair of frequency converters supplied with the inphase and the quadrature phase standard signals, respectively. It is, thereby possible to carry out the frequency stabilization by the use of a phase variation that appears in the frequency-converted signals of a lower frequency with a variation, if any, in the carrier frequency. Although excellent in respect of the frequency stability, the improved models are objectionable in complexity of the circuitry and bulkiness of the equipment.

SUMMARY OF THE INVENTION

It is, therefore, an object of the present invention to provide a frequency discriminator having a stable center frequency that is little affected by the ambient temperature.

It is another object of this invention to provide a frequency discriminator of the type described, capable of providing an automatic frequency control loop that is simple in circuitry, compact, and yet operable to provide an excellent frequency stability.

It is still another object of this invention to provide a frequency discriminator of the type described, capable of providing an AFC loop that need not comprise a frequency converter.

According to this invention, there is provided a frequency discriminator responsive to a first input signal of a first frequency and a first phase and a second input signal of a second frequency and a second phase for producing a discriminator output signal representative of the difference between the first and the second frequencies in a predetermined one of two cases where either the first frequency is higher than the second frequency or the first frequency is lower than the second frequency. The first and the second frequencies are not lower than a predetermined frequency. The frequency discriminator comprises phase detector means responsive to the first and the second input signals for producing first and second substantially rectangular pulse sequences. A first substantially rectangular pulse sequence takes a predetermined peak value with an instantaneous frequency corresponding to the difference between the first and the second phases while the second substantially rectangular pulse sequence continuously has the peak value if the first phase leads the second phase by 0° through 180°. The second substantially rectangular pulse sequence takes the peak value with the instantaneous frequency while the first substantially rectangular pulse sequence continuously has the peak value if the first phase lags behind the second phase by 0° through 180°. The frequency discriminator further comprises a low-pass filter having a prescribed high-cutoff frequency lower than the predetermined frequency for producing a low-pass output signal in response to a prescribed one of the first and the second substantially rectangular pulse sequences, a high-pass filter having a prescribed low-cutoff frequency lower than the high-cutoff frequency for producing a high-pass output signal in response to the low-pass output signal, and output means responsive to the high-pass output signal for producing the discriminator output signal.

As will readily be understood from the context, the terms "first phase" and "second phase" are used to briefly set forth the relation in phase between the first and the second input signals. Also, the "high-cutoff" and the "low-cutoff" frequencies mean the cutoff frequencies for the higher and the lower frequency components, respectively.

Preferably, a frequency discriminator according to this invention still further comprises a second low-pass filter having a second prescribed high-cutoff frequency lower than the predetermined frequency for producing a second low-pass output signal in response to the other of the first and the second substantially rectangular pulse sequences, a second high-pass filter having a second prescribed low-cutoff frequency lower than the second high-cutoff frequency for producing a second high-pass output signal in response to the second low-pass output signal, and second output means responsive to the second high-pass output signal for producing a second discriminator output signal representative of the difference between the first and the second frequencies in the other of the two cases.

DESCRIPTION OF THE PREFERRED EMBODIMENT

Figure 1:
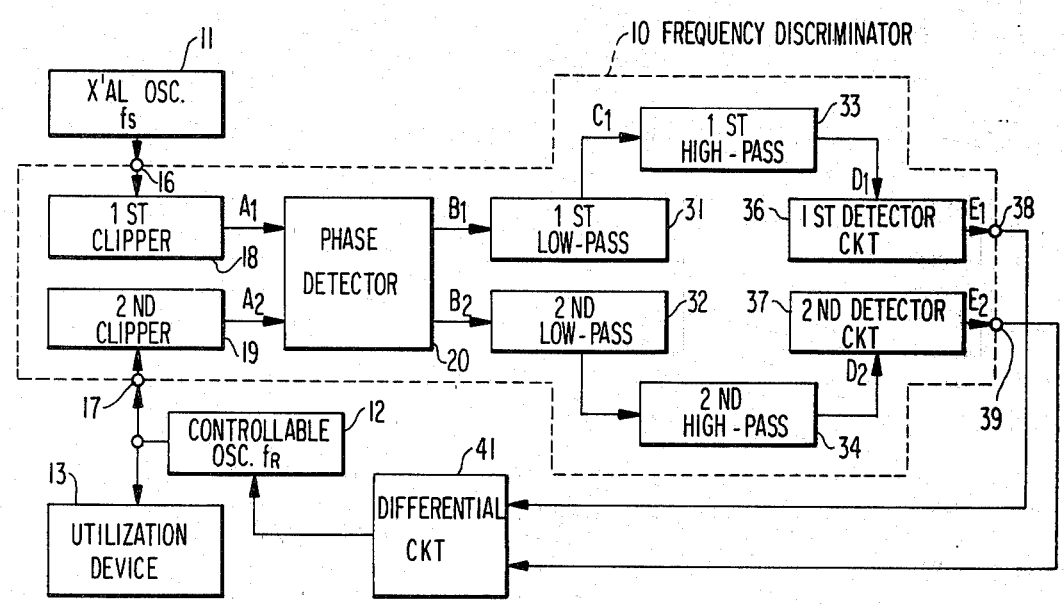
FIG. 1 is a block diagram of a frequency discriminator according to a preferred embodiment of the instant invention together with an AFC loop for a controllable oscillator.

Referring to FIG. 1, a frequency discriminator 10 according to a preferred embodiment of the present invention is used in an AFC loop comprising a crystal oscillator 11 for generating a reference signal and a controllable oscillator 12, such as a voltage controlled oscillator or frequency modulator, for supplying a frequency-stablized power signal to a utilization device 13 that may be an amplifier. For the frequency discriminator 10, the reference and the power signals are supplied to first and second input terminals 16 and 17, respectively. Either or each of the reference and the power signals may be supplied to the input terminals 16 and 17 through a frequency divider or multiplier (not shown). In any event, the signals supplied to the respective terminals 16 and 17 are herein named the reference and the power signals, respectively. For convenience of further description, it is defined here that the reference and the power signals are supplied to the input terminals 16 and 17 with a reference frequency $f_S$ and a first phase and with a controllable frequency $f_R$ and a second phase, respectively. When the controllable OSC 12 is a frequency modulator while the output signals of the crystal and the controllable oscillators 11 and 12 are directly supplied to the frequency discriminator 10, the reference frequency $f_S$ corresponds to the center frequency of the frequency-modulated signal. At any rate, the reference and the controllable frequencies are nearly equal to each other and are higher than a predetermined frequency.

Further referring to FIG. 1, first and second clipper circuits 18 and 19 are supplied with the reference and the power signals through the first and the second input terminals 16 and 17 and produce first and second rectangular signals $A_1$ and $A_2$, respectively. The rectangular signals $A_1$ and $A_2$ have the reference and the controllable frequencies $f_S$ and $f_R$ as their respective fundamental frequencies and serve as a first and a second substantially digital signal representative of the reference frequency $f_S$ and the first phase and of the controllable frequency $f_R$ and the second phase, respectively. Supplied with the rectangular signals $A_1$ and $A_2$, a phase detector 20 produces first and second substantially rectangular pulse sequences $B_1$ and $B_2$. When the first phase leads the second phase by 0° through 180°, the first sequence $B_1$ takes a predetermined peak value with an instantaneous frequency corresponding to the phase difference between the first and the second phases while the second pulse sequence $B_2$ continually has the peak value. When the first phase lags behind the second phase by 0° through 180°, the second sequence $B_2$ takes the peak value with the instantaneous frequency while the first sequence $B_1$ is kept at the peak value.

Figure 2:
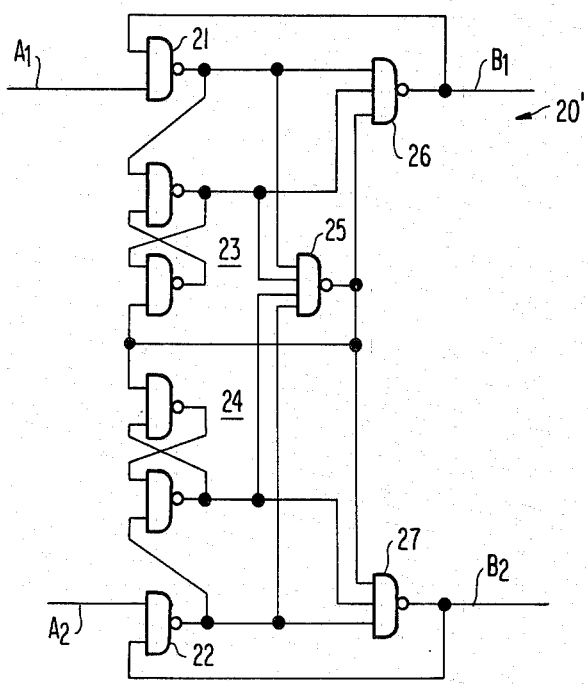
FIG. 2 is a logic diagram of a phase detector for use in a frequency discriminator according to the preferred embodiment of this invention.

Referring temporarily to FIG. 2, a digital phase detector 20' for use in a frequency discriminator according to the preferred embodiment of this invention comprises first and second NAND circuits 21 and 22 supplied with the first and the second rectangular signals $A_1$ and $A_2$, respectively, and further comprises first and second flip-flops 23 and 24, a four-input NAND circuit 25, and first and second output NAND circuits 26 and 27, all coupled to the input NAND circuits 21 and 22 so as to digitally detect the phase difference between the rectangular signals $A_1$ and $A_2$. If the first phase leads the second phase by 0° through 180°, first and second phase detection signals produced by the output NAND circuits 26 and 27 as the first and the second substantially rectangular pulse sequences $B_1$ and $B_2$ are switched between logic "1" and "0" with the above-mentioned instantaneous frequency and kept continually at logic "1," respectively. When the first phase lags behind the second phase by 0° through 180°, the first and the second phase detection signals are kept at logic "1" and rendered alternatingly logic "1" and "0" with the instantaneous frequency, respectively. The digital phase detector 20' corresponds to the "digital phase detector" and a part of the "phase-frequency detector #1" or "phase detector" shown on pages 15 and 19, respectively, of *Phase-Locked Loop Data Book*, Second Edition (August 1973), published by Motorola Semiconductor Products, Inc., Phoenix, Ariz.

Turning back to FIG. 1, the first and the second substantially rectangular pulse sequences $B_1$ and $B_2$ are individually supplied to first and second low-pass filters 31 and 32 having a first and a second prescribed high-cutoff frequency, respectively, that are lower than the predetermined frequency. Rejecting those components of the first substantially rectangular pulse sequence $B_1$ which have the fundamental frequency of the first rectangular signal $A_1$ and higher harmonic frequencies, the first low-pass filter 31 delivers a first low-pass output signal $C_1$ to a first high-pass filter 33 having a first prescribed low-cutoff frequency lower than the first high-cutoff frequency. Rejecting those components of the second substantially rectangular pulse sequence $B_2$ which are equal to or higher in frequency than the fundamental frequency of the second rectangular signal $A_2$, the second low-pass filter 32 supplies a second low-pass output signal $C_2$ to a second high-pass filter 34 having a second prescribed low-cutoff frequency lower than the second high-cutoff frequency. Rejecting lower frequency components of the low-pass filter output signals $C_1$ and $C_2$, the high-pass filters 33 and 34 produce first and second high-pass output signals $D_1$ and $D_2$, respectively. As will later be described in more detail, each of the high-pass output signals $D_1$ and $D_2$ goes positive and negative. If the controllable frequency $f_R$ is not higher than the reference frequency $f_S$, the first and the second high-pass output signals $D_1$ and $D_2$ have in average a positive value dependent on the frequency difference between the reference and the controllable frequencies $f_S$ and $f_R$ and another value substantially equal to zero, respectively. When the controllable frequency $f_R$ is higher than the reference frequency $f_S$, the second high-pass output signal $D_2$ alone has a positive average dependent on the frequency difference while the first high-pass output signal $D_1$ has a substantially zero average. It is possible to prescribe a common high-cutoff and a common low-cutoff frequency for the low-pass filters 31 and 32 and for the high-pass filters 33 and 34, respectively. Frequency discrimination characteristics of the frequency discriminator 10 are decided by the high-cutoff frequencies or frequency.

Further referring to FIG. 1, first and second detector circuits 36 and 37 are individually supplied with the first and the second high-pass output signals $D_1$ and $D_2$ and carry out integration of signals of frequencies lower than the low-cutoff frequencies or frequency to deliver first and second substantially d.c. signals $E_1$ and $E_2$ to first and second output terminals 38 and 39, respectively, as one and the other of a pair of discriminator output signals. In the AFC loop, a differential circuit 41, such as a differential amplifier, is supplied with the d.c. signals $E_1$ and $E_2$ and supplies a control signal to the controllable oscillator 12 so as to render the controllable frequency $f_R$ equal to the reference frequency $f_S$. When the controllable oscillator 12 is a voltage controlled oscillator, the control signal is applied to a variable capacitance element (not shown). It is now understood that the reference and the power signals may be supplied to the second and the first input terminals 17 and 16, respectively, and that the high-pass output signals $D_1$ and $D_2$ may be used as the discriminator output signal pair without the use of the detector circuits 36 and 37. When it is unnecessary to discriminate those frequency ranges of the controllable frequency $f_R$ which are lower than the reference frequency $f_S$, use is unnecessary of the first substantially rectangular pulse sequence $B_1$ and the first low-pass and high-pass filters 31 and 33. Similarly, when it is unnecessary to discriminate those frequency ranges of the controllable frequency $f_R$ which are higher than the reference frequency $f_S$, use is unnecessary of the second substantially rectangular pulse sequence $B_2$ and the second low-pass and high-pass filters 32 and 34.

Figure 3:
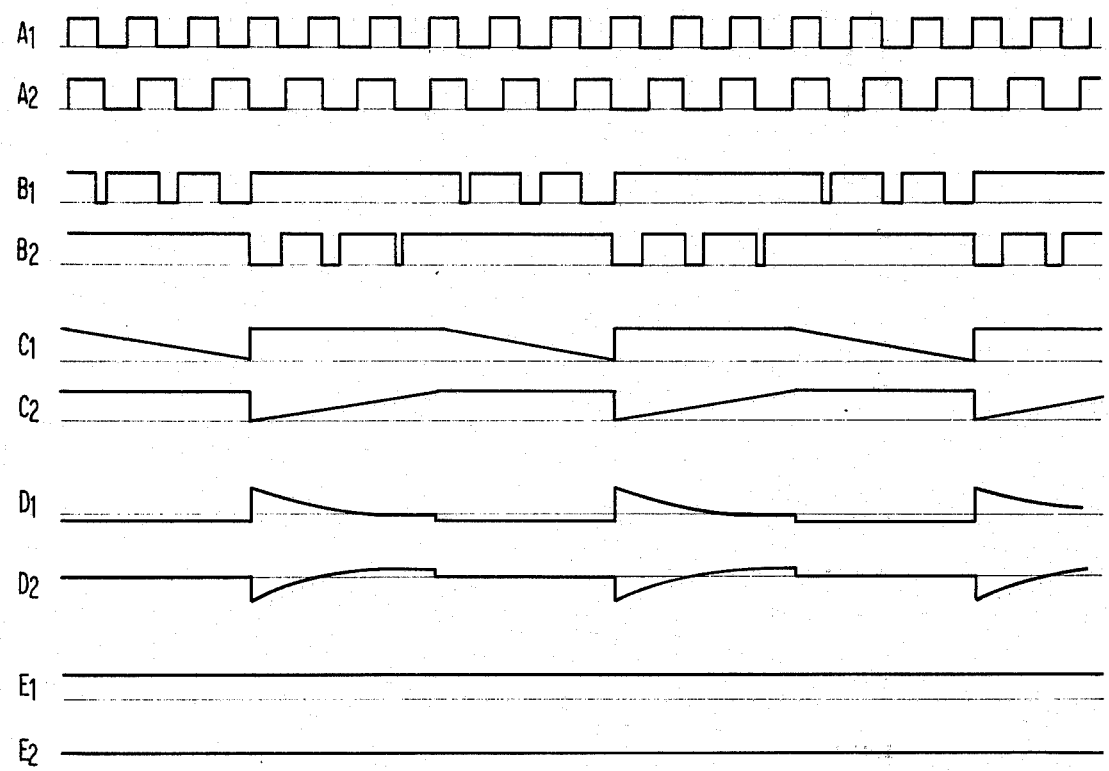
FIG. 3 is a schematic time chart of several signals that appear in the frequency discriminator according to the preferred embodiment of this invention.

Referring now to FIG. 3 in addition to FIGS. 1 and 2, let it be presumed at first that the controllable frequency $f_R$ is lower than the reference frequency $f_S$. The first rectangular signal $A_1$ is higher in frequency than that of the second signal $A_2$ as depicted along the two top rows labelled $A_1$ and $A_2$. The first and the second substantially rectangular pulse sequences $B_1$ and $B_2$ vary between logic "1" and "0" with a common beat frequency equal to $|f_S-f_R|$ as shown along the next two rows labelled $B_1$ and $B_2$. As exemplified along the two middle rows labelled $C_1$ and $C_2$, the amplitude of the first low-pass output signal $C_1$ is kept substantially constant while the first phase lags behind and decreases to a minimum while the first phase leads the second phase by 0° through 180°, respectively. The amplitude of the second low-pass filter output signal $C_2$ increases from a minimum to a constant amplitude while the first phase lags behind and is kept substantially at the constant amplitude while the first phase leads the second phase by 0° through 180°, respectively. As shown along the next rows labelled $D_1$ and $D_2$, the first high-pass output signal $D_1$ has a slightly negative value and suddenly goes positive to gradually decrease to zero while the first low-pass output signal $C_1$ decreases to the minimum and jumps from the minimum up to the constant amplitude to be substantially kept there, respectively. The second high-pass output signal $D_2$ is kept substantially at zero and suddenly goes negative to steadily build up to a slightly positive value while the second low-pass output signal $C_2$ is kept substantially at the constant amplitude and jumps from the constant amplitude down to the minimum to progressively return to the constant amplitude, respectively. The first and the second substantially d.c. signals $E_1$ and $E_2$, therefore, have a positive value dependent on the frequency difference $|f_S-f_R|$ and a substantially zero value, respectively, as shown along the two bottom rows labelled $E_1$ and $E_2$.

From FIG. 3, it is obvious that the second and the first substantially d.c. signals $E_2$ and $E_1$ have a positive value dependent on the frequency difference $|f_S-f_R|$ and substantially zero value when the controllable frequency $f_R$ is not lower than the reference frequency $f_S$.

In connection with the above, it may be mentioned here that the beat frequency $|f_S-f_R|$ is lower than the low-cutoff frequencies or frequency of the high-pass filters 33 and 34 unless the controllable frequency $f_R$ is much different from the reference frequency $f_S$ and that the low-pass output signals $C_1$ and $C_2$ are attenuated by the transfer characteristics of the respective high-pass filters 33 and 34 to appear as the high-pass output signals $D_1$ and $D_2$ one of which is substantially zero in average while the other of which has a positive average substantially proportional to the frequency difference $|f_S-f_R|$. The frequency discrimination characteristics of a frequency discriminator according to this invention are thus for frequencies sufficiently lower than the predetermined frequency and are unambiguously defined by the low-cutoff frequencies or frequency irrespective of the absolute values of the controllable and the reference frequencies $f_R$ and $f_S$. This astonishingly reduces the adverse effects which otherwise are caused on the center frequency of the frequency discriminator by the variations in the circuit constants thereof.

Figure 4:
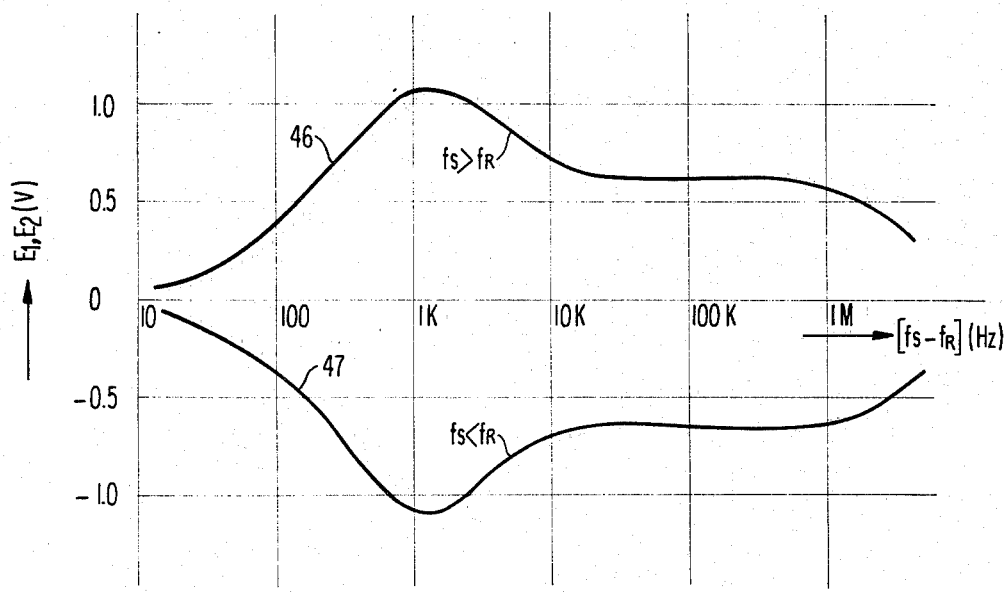
FIG. 4 shows actually measured frequency discrimination characteristics of a frequency discriminator according to the preferred embodiment of this invention.

Finally, referring to FIG. 4, actually measured frequency discrimination characteristics of a frequency discriminator according to the above-described preferred embodiment of this invention are shown by curves 46 and 47 representative of the first and the second substantially d.c. signals $E_1$ and $E_2$ in volts versus the frequency difference $|f_S-f_R|$ in Hz given on a logarithmic scale. The nominal controllable frequency was 13.5 MHz. The common high-cutoff and low-cutoff frequencies were prescribed at 3 MHz and 2 kHz, respectively. The curves 46 and 47 show that this frequency discriminator has an excellent frequency discrimination sensitivity for frequency differences $|f_S-f_R|$ in the vicinity of 1 kHz. The frequency stability was about 0.3 PPM/°C.

While frequency discriminators according to the preferred embodiment of this invention and a few modifications thereof have thus far been described as used in an AFC loop for a frequency modulator, it is obvious that the power signal may be used without being supplied to any utilization device and that a frequency discriminator according to this invention is equally well applicable to a frequency demodulator and other purposes. The digital phase detector 20' is readily manufactured as an integrated circuit. It is possible to use any other circuit as the phase detector 20.

What is claimed is:

1. A frequency discriminator responsive to a first input signal of a first frequency and a first phase and a second input signal of a second frequency and a second phase for producing a discriminator output signal representative of the difference between said first and said second frequencies in a predetermined one of two cases where said first frequency is either greater than or lower than said second frequency, said first and said second frequencies being greater than a predetermined frequency, said frequency discriminator comprising:

phase detector means responsive to said first and said second input signals for producing first and second substantially rectangular pulse sequences, said first substantially rectangular pulse sequence taking a predetermined peak value with an instantaneous frequency corresponding to the difference between said first and said second phases while said second substantially rectangular pulse sequence continuously has said peak value if said first phase leads said second phase by 0° through 180°, said second substantially rectangular pulse sequence taking said peak value with said instantaneous frequency while said first substantially rectangular pulse sequence continuously has said peak value if said first phase lags behind said second phase by 0° through 180°;

a low-pass filter having a prescribed high-cutoff frequency less than said predetermined frequency for producing a low-pass second output signal in response to a prescribed one of said first and said second substantially rectangular pulse sequences;

a high-pass filter having a prescribed low-cutoff frequency lower than said high-cutoff frequency for producing a high-pass output signal in response to said low-pass output signal; and output means responsive to said high-pass output signal for producing said discriminator output signal.

2. A frequency discriminator as claimed in claim 1, wherein said output means comprises a detector circuit responsive to said high-pass output signal for producing a substantially d.c. signal as said discriminator output signal.

3. A frequency discriminator as claimed in claim 1, which further comprises:

a second low-pass filter having a second prescribed high-cutoff frequency lower than said predetermined frequency for producing a second low-pass output signal in response to the other of said first and said second substantially rectangular pulse sequences;

a second high-pass filter having a second prescribed low-cutoff frequency lower than said second high-cutoff frequency for producing a second high-pass output signal in response to said second low-pass output signal; and second output means responsive to said second high-pass output signal for producing a second discriminator output signal representative of the difference between said first and said second frequencies in the other of said two cases.

4. A frequency discriminator as claimed in claim 3, wherein said first and second output means respectively comprise first and second detector circuits, respectively, responsive to said first and second high-pass output signals for producing first and second substantially d.c. signals as said first and second discriminator output signals.

5. A frequency discriminator as claimed in claim 4, and used in an automatic frequency control loop, said automatic frequency control loop comprising:

controllable oscillator means for generating an oscillation signal of a controllable frequency higher than said predetermined frequency;

means for supplying said oscillation signal to said phase detector means as a predetermined one of said first and said second input signals;

a differential circuit responsive to both of said substantially d.c. signals for producing a control signal; and means for supplying said control signal to said controllable oscillator means to render said controllable frequency substantially equal to the frequency of the other of said first and said second input signals.

6. A frequency discriminator as claimed in claim 1, wherein said phase detector means comprises:

input means responsive to said first and said second input signals for producing a pair of substantially digital signals representative of said first frequency and said first phase and of said second frequency and said second phase, respectively; and a digital phase detector responsive to said substantially digital signals for producing said first and said second substantially rectangular pulse sequences.

* * * * *